United States Patent
Jindo et al.

(10) Patent No.: US 11,195,702 B2
(45) Date of Patent: Dec. 7, 2021

(54) PLASMA-GENERATING DEVICE

(71) Applicant: FUJI CORPORATION, Chiryu (JP)

(72) Inventors: Takahiro Jindo, Anjo (JP); Toshiyuki Ikedo, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 104 days.

(21) Appl. No.: 16/500,498

(22) PCT Filed: Apr. 4, 2017

(86) PCT No.: PCT/JP2017/014093
§ 371 (c)(1),
(2) Date: Oct. 3, 2019

(87) PCT Pub. No.: WO2018/185838
PCT Pub. Date: Oct. 11, 2018

(65) Prior Publication Data
US 2021/0111006 A1    Apr. 15, 2021

(51) Int. Cl.
*H01J 37/32* (2006.01)

(52) U.S. Cl.
CPC ... *H01J 37/32568* (2013.01); *H01J 37/32825* (2013.01)

(58) Field of Classification Search
None
See application file for complete search history.

(56) References Cited

U.S. PATENT DOCUMENTS

| 5,397,961 A | 3/1995 | Ayers et al. |
|---|---|---|
| 2010/0130911 A1 | 5/2010 | Morfill et al. |
| 2013/0168361 A1* | 7/2013 | Hori .......... B23H 1/00 219/69.11 |
| 2014/0239812 A1 | 8/2014 | Valdes et al. |

FOREIGN PATENT DOCUMENTS

| EP | 2 432 087 A2 | 3/2012 |
|---|---|---|
| JP | 2003-249490 A | 9/2003 |
| JP | 2010-530115 A | 9/2010 |
| JP | 2016-38940 A | 3/2016 |

OTHER PUBLICATIONS

International Search Report dated Jun. 27, 2017 in PCT/JP2017/014093 filed on Apr. 4, 2017.
Extended European Search Report dated Mar. 30, 2020 in European Patent Application No. 17904636.2, citing documents AA, AB, and AO therein, 8 pages.

* cited by examiner

*Primary Examiner* — Ashok Patel
(74) *Attorney, Agent, or Firm* — Oblon, McClelland, Maier & Neustadt, L.L.P.

(57) ABSTRACT

A plasma-generating device including: a pair of electrodes; a pair of holders configured to hold ends of the pair of electrodes in a protruding state; and a casing in which is formed a first recess and that is configured to combine with the pair of holders in a state with the ends of the pair of electrodes that protrude from the pair of holders inserted into the first recess, wherein the combined casing and the pair of holders contact each other only at an opposite side to a side between the ends of the pair of electrodes that project from the pair of holders.

6 Claims, 8 Drawing Sheets

PLASMA-GENERATING DEVICE

TECHNICAL FIELD

The present application relates to a plasma-generating device for generating a plasma gas via electrical discharge between the ends of a pair of electrodes.

BACKGROUND ART

In a plasma-generating device, as disclosed in the patent literature below, processing gas is supplied to a reaction chamber and electric power is supplied to multiple electrodes arranged in the reaction chamber. As a result, electrical discharge is generated in the reaction chamber, and the processing gas is converted into plasma.

CITATION LIST

Patent Literature

Patent literature 1: JP-A-2016-038940

BRIEF SUMMARY

Technical Problem

In a plasma-generating device, because plasma is generated by electrical discharge between electrodes, members constituting the plasma-generating device deteriorate due to the electrical discharge. Therefore, an object of the present disclosure is to prevent deterioration of a member constituting a plasma-generating device.

Solution to Problem

To solve the above problems, disclosed herein is a plasma-generating device including: a pair of electrodes; a pair of holders configured to hold ends of the pair of electrodes in a protruding state; and a casing configured to combine with the pair of holders, wherein the combined casing and the pair of holders contact each other only at an opposite side to a side between the ends of the pair of electrodes that project from the pair of holders.

Advantageous Effects

According to the present disclosure, it is possible to curtail entry of plasma and thus prevent deterioration of members constituting the plasma-generating device.

DESCRIPTION OF EMBODIMENTS

The following describes in detail referring to the figures an example embodiment of the present disclosure.

(A) Configuration of the Atmospheric Pressure Plasma-Generating Device

Figure 1:
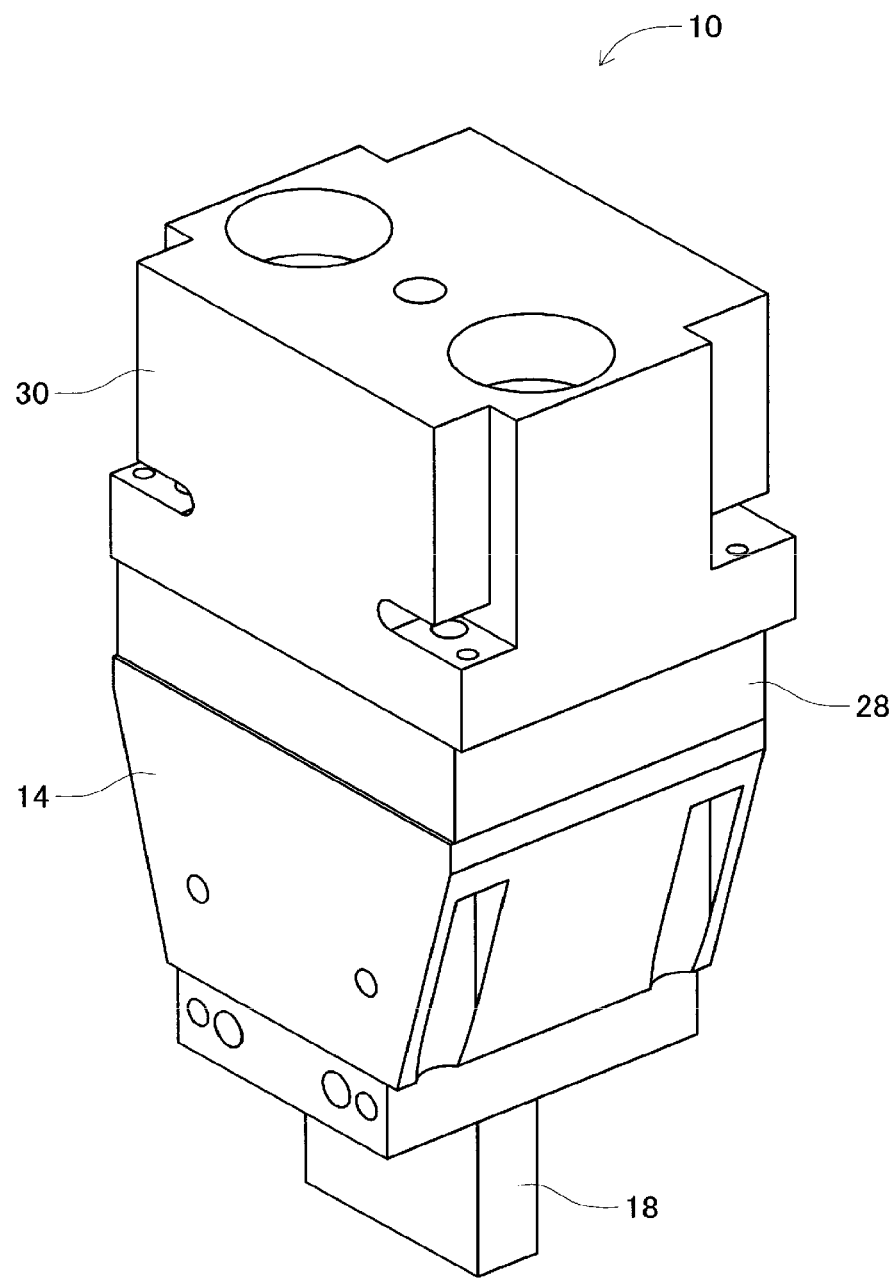
FIG. 1 is a perspective view of an atmospheric pressure plasma generating device.
Figure 2:
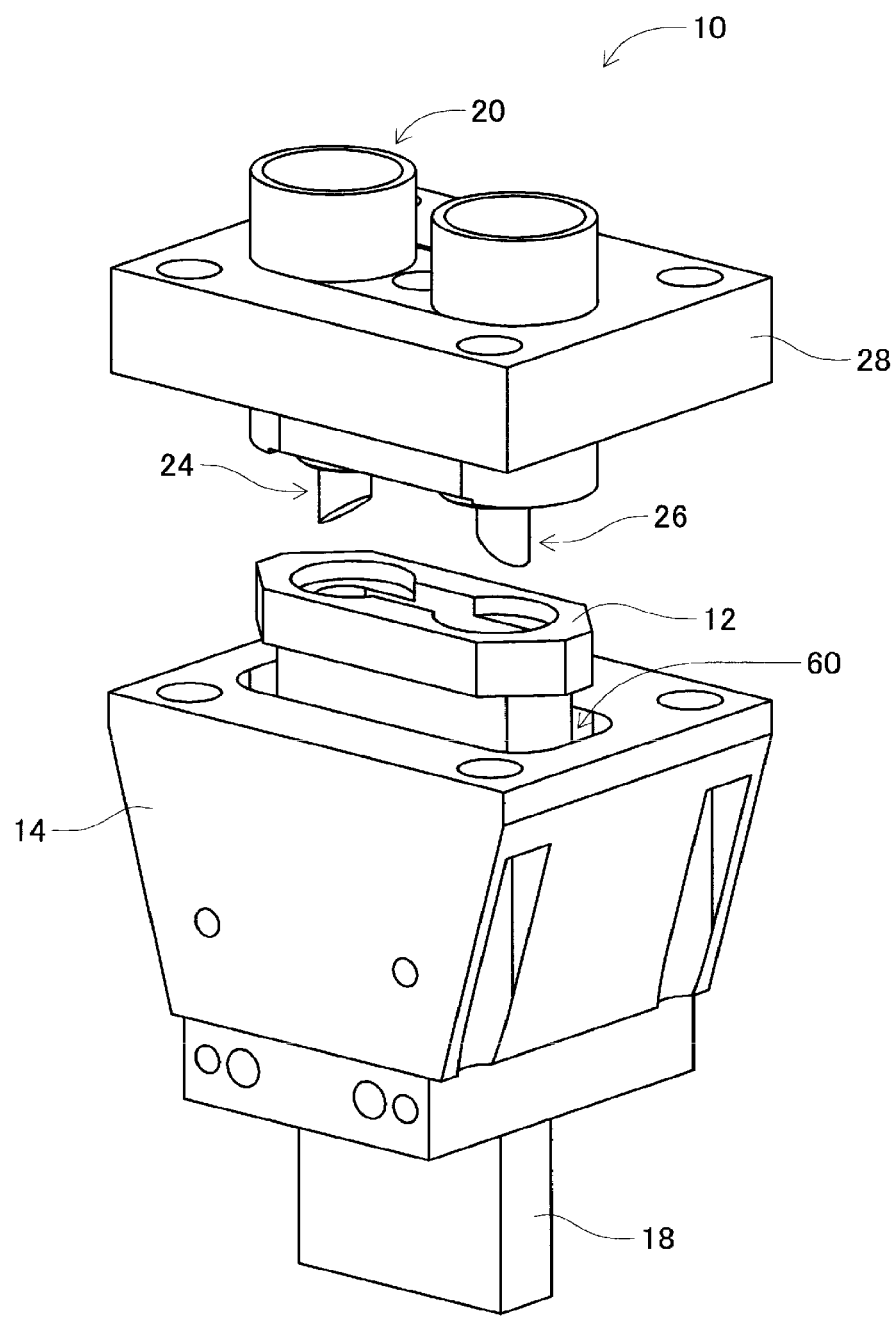
FIG. 2 is an exploded view showing the atmospheric pressure plasma-generating device.
Figure 3:
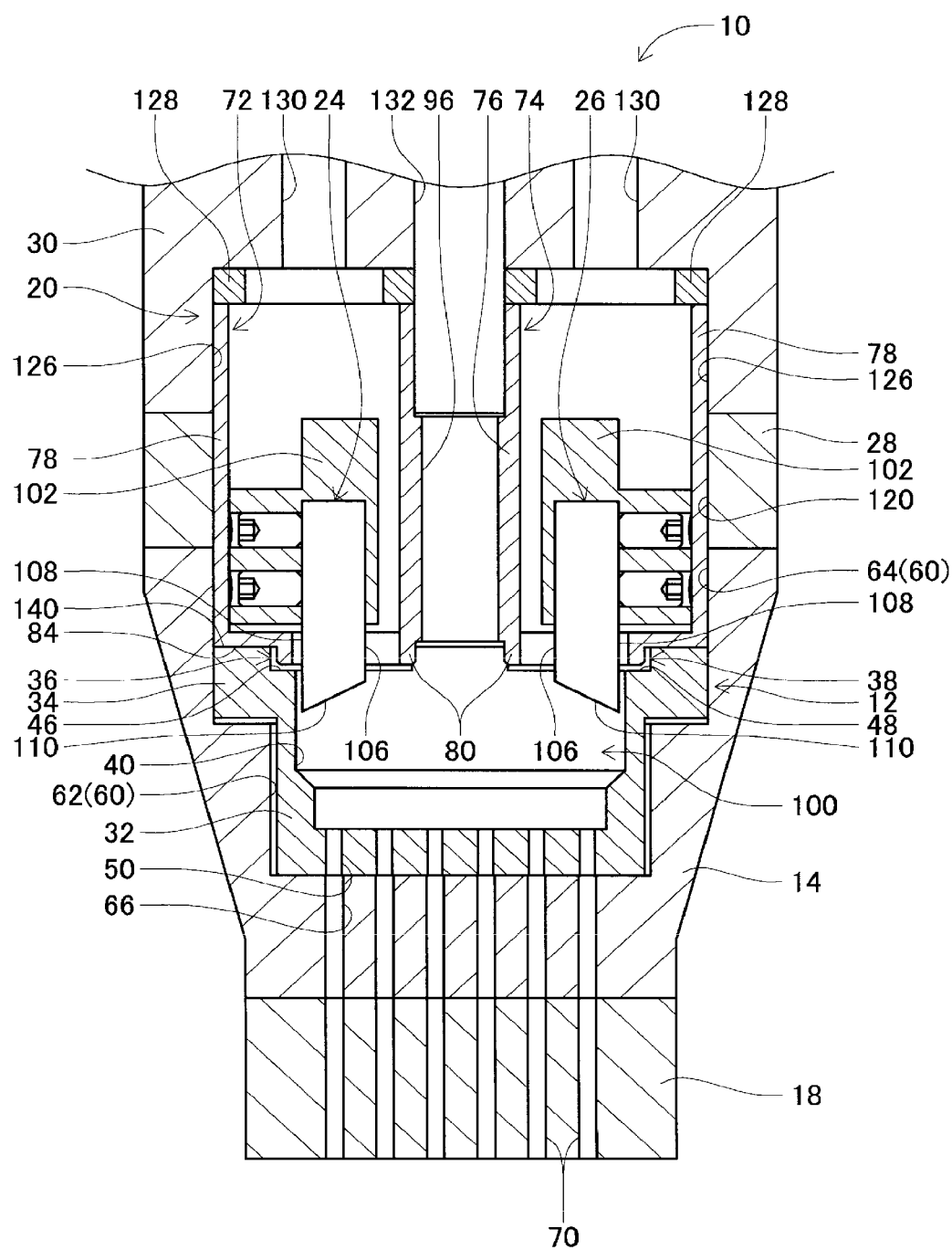
FIG. 3 is a cross section of the atmospheric pressure plasma-generating device.

FIGS. 1 to 3 show an embodiment of the present disclosure, atmospheric pressure plasma-generating device 10. Atmospheric pressure plasma-generating device 10 is for generating plasma at atmospheric pressure. Atmospheric pressure plasma-generating device 10 includes internal block 12, lower block 14, emitting nozzle 18, holding member 20, pair of electrodes 24 and 26, connecting member 28, and upper block 30. FIG. 1 is a perspective view of atmospheric pressure plasma-generating device 10; FIG. 2 is an exploded view showing the atmospheric pressure plasma-generating device 10 without upper block 30; FIG. 3 is a cross section of atmospheric pressure plasma-generating device 10.

Figure 4:
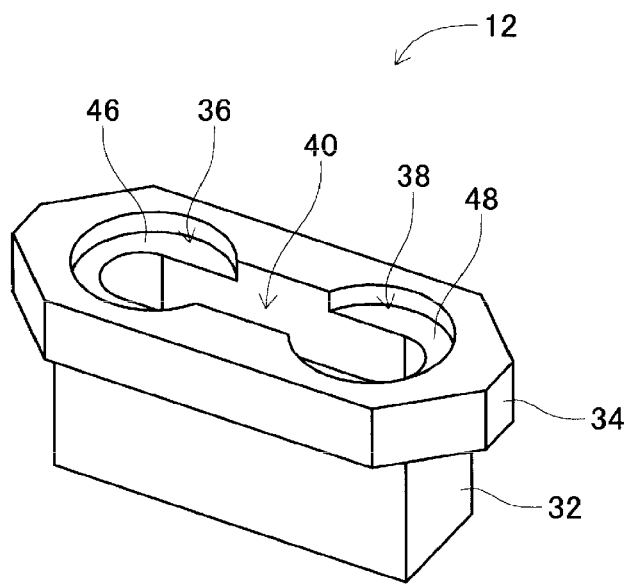
FIG. 4 is a perspective view of an internal block.
Figure 5:
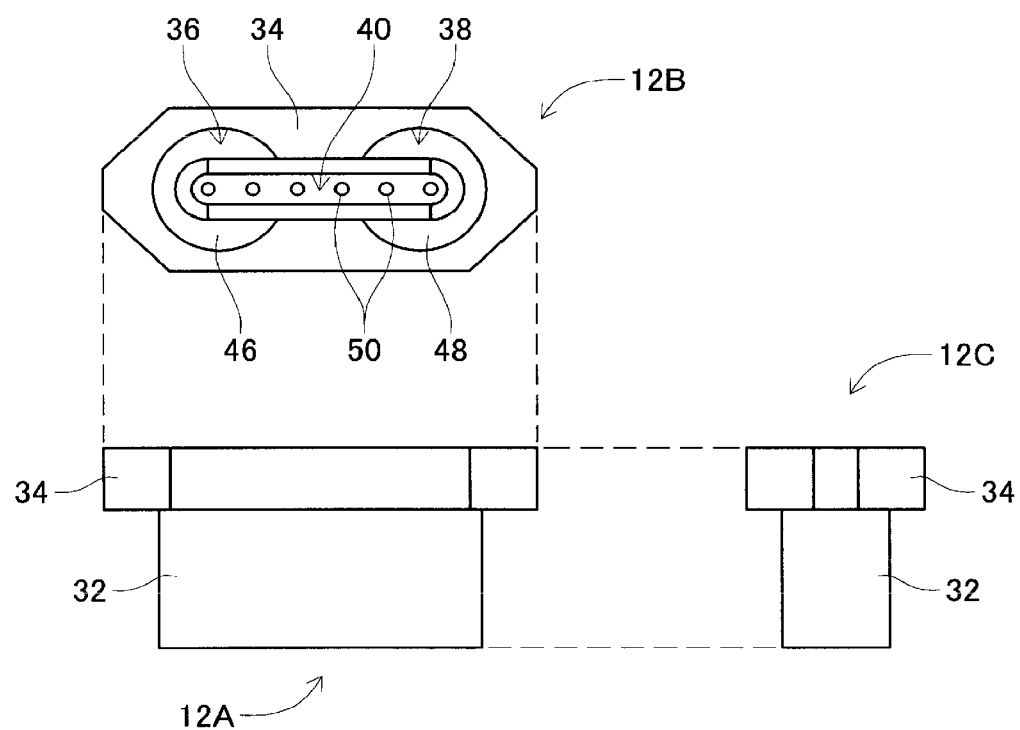
FIG. 5 shows front, top, and side views of the internal block.

Internal block 12 is formed of ceramic and, as shown in FIGS. 4 and 5, is configured from generally cuboid main body section 32 and flange section 34 formed on an upper edge of main body section 32. FIG. 4 is a perspective view of internal block 12, and FIG. 5 is a front view of the internal block 12A, a top view of the internal block 12B, and a side view of the internal block 12C.

A pair of cylindrical recesses 36 and 38 are formed on an upper surface of flange section 34 of internal block 12. Further, connecting recess 40 is formed from the bottom surface of the pair of cylindrical recesses 36 and 38 toward the inside of main body section 32 so as to connect the pair of cylindrical recesses 36 and 38. The width of connecting recess 40 is smaller than the diameters of cylindrical recesses 36 and 38, so the bottom surfaces of cylindrical recesses 36 and 38 are approximately U-shaped stepped surfaces 46 and 48. Also, connecting recess 40 has a stepped shape whose width becomes narrower toward the bottom surface, and six first flow paths 50 are formed on the bottom surface of connecting recess 40 so as to extend vertically. Further, the six first flow paths 50 open to the bottom surface of internal block 12. Note that, the width direction of a component in this specification means a short direction, that is, a direction perpendicular to the longitudinal direction when the component is generally rectangular. The longitudinal direction is referred to as the length direction.

As shown in FIG. 2, lower block 14 has an approximately cuboid shape and is formed of ceramic. Accommodation section 60 for accommodating internal block 12 is formed on an upper surface of lower block 14. Accommodation section 60 is a bottomed hole that opens to an upper surface of lower block 14, and, as shown in FIG. 3, is configured from first accommodation section 62 located on the bottom surface side and second accommodation section 64 located on the opening side.

The depth dimension of first accommodation section 62 is substantially the same as the height dimension of main body section 32 of internal block 12, and the width dimension and length dimension of first accommodation section 62 are slightly longer than the width dimension and length dimension of main body section 32 of internal block 12. The depth dimension of second accommodation section 64 is longer than the height dimension of flange section 34 of internal block 12, and the width dimension and length dimension of second accommodation section 64 are slightly longer than the width dimension and length dimension of flange section 34 of internal block 12. Therefore, internal block 12 is inserted from the opening of accommodation section 60, main body section 32 of internal block 12 is accommodated in first accommodation section 62, and flange section 34 of internal block 12 is accommodated in second accommodation section 64. Since the depth dimension of second accommodation section 64 is longer than the height dimension of flange section 34, the upper surface of flange section 34, that is, the upper surface of internal block 12 is located below the upper surface of lower block 14 in accommodation section 60. That is, the entire internal block 12 is enclosed in accommodation section 60 of lower block 14.

Six second flow paths 66 are formed on the bottom surface of accommodation section 60, that is, the bottom surface of first accommodation section 62 so as to extend vertically, and the six second flow paths 66 open to the bottom surface of lower block 14. By internal block 12 being accommodated in accommodation section 60, second flow paths 66 and first flow paths 50 of internal block 12 are connected.

Emitting nozzle 18 is fixed to a lower surface of lower block 14. Six third flow paths 70 are formed in emitting nozzle 18 so as to extend vertically, and the six third flow paths 70 open to an upper surface and a lower surface of emitting nozzle 18. Each of the third flow paths 70 is connected to a respective second flow path 66 of internal block 12.

Figure 6:
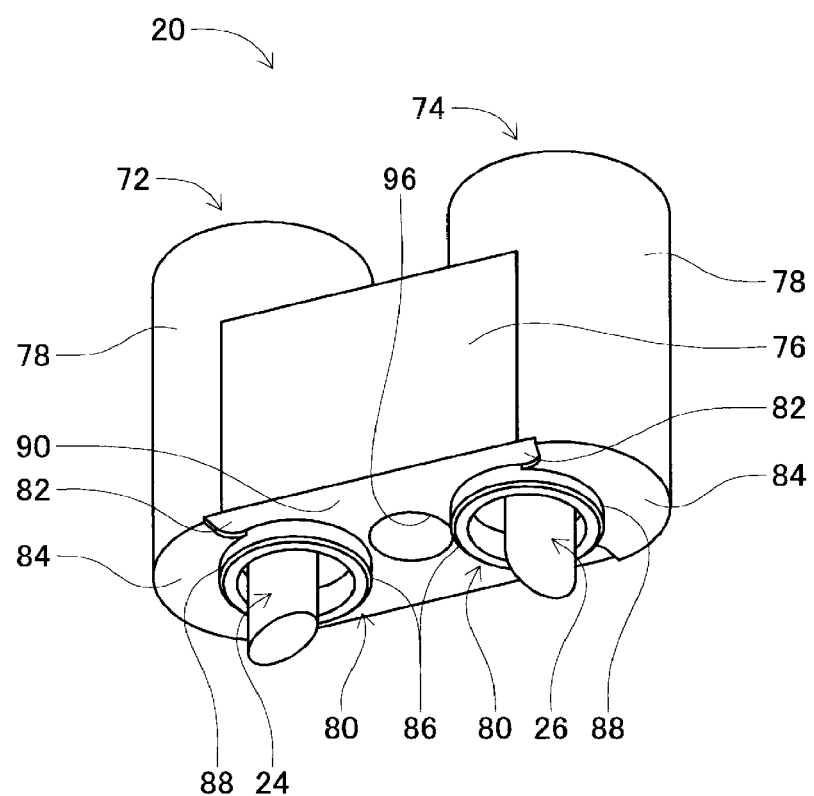
FIG. 6 is a perspective view showing a holding member.
Figure 7:
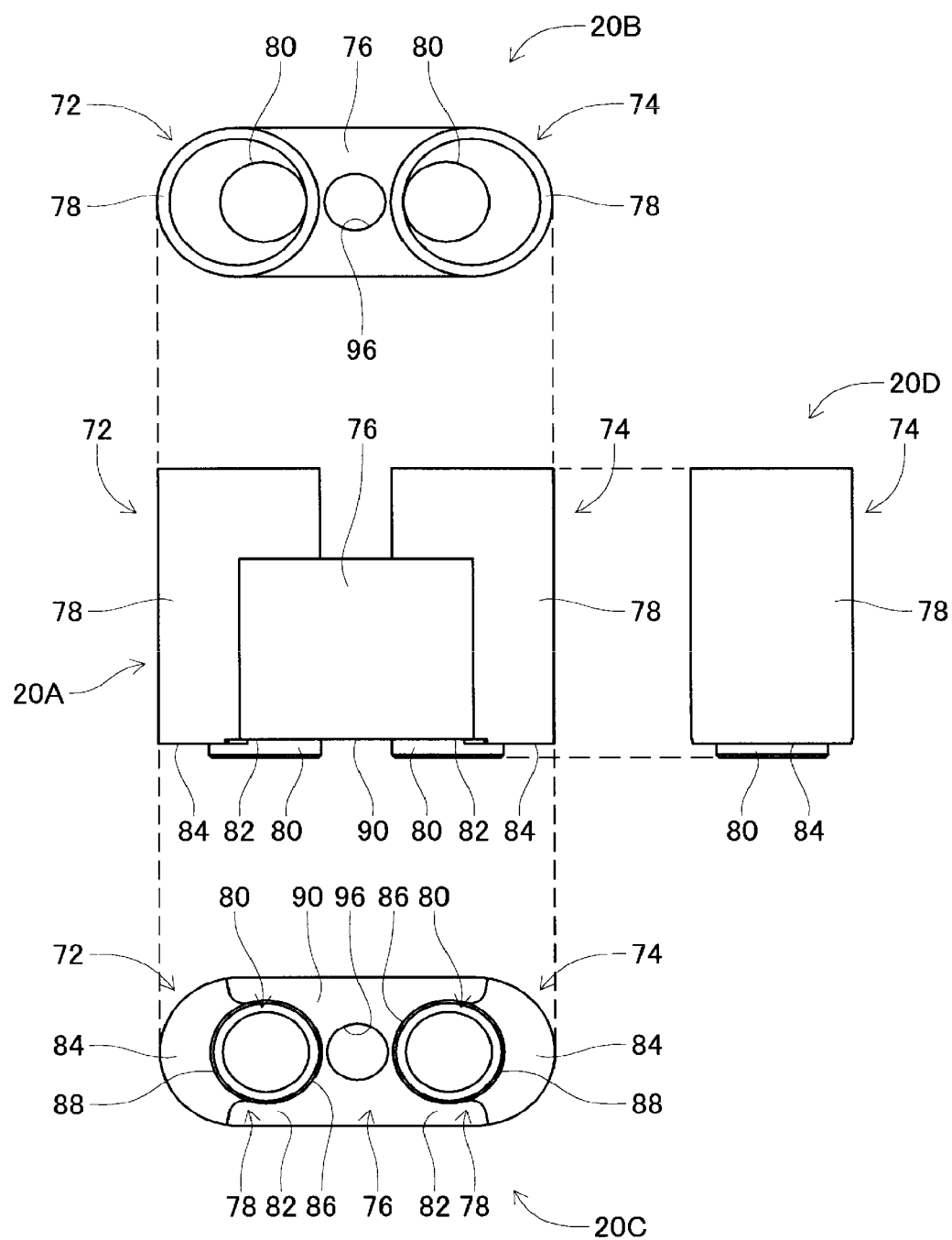
FIG. 7 shows front, top, bottom, and side views of the holding member.

Holding member 20 is formed of ceramic and, as shown in FIGS. 6 and 7, is configured from pair of holders 72 and 74 and connecting section 76. The pair of holders 72 and 74 are arranged spaced apart from each other with their side surfaces facing each other, and are connected to each other by connecting section 76. Each of the pair of holders 72 and 74 is configured from main body section 78 and protruding section 80. Main body section 78 is substantially shaped as a bottomed cylinder. Protruding section 80 has a short cylindrical shape having a diameter smaller than that of main body section 78, and protrudes slightly downward from the bottom surface of main body section 78. The upper end of protruding section 80 opens to the bottom surface of main body section 78.

The outer diameter of main body section 78 is substantially the same as the width dimension of flange section 34 of internal block 12, and the outer diameter of protruding section 80 is slightly smaller than the inner diameter of cylindrical recesses 36 and 38 of internal block 12. Further, the axial centers of protruding sections 80 of the pair of holders 72 and 74 are shifted towards each other from the axial center of main body section 78, and the separation distance of the pair of protruding sections 80 is set to be the same as the separation distance of the pair of cylindrical recesses 36 and 38 of internal block 12.

Further, the bottom surface of each main body section 78 of the pair of holders 72 and 74 is a stepped surface, and is configured from first bottom surface 82 and second bottom surface 84. Second bottom surface 84 protrudes downward from first bottom surface 82. Second bottom surface 84 is formed to extend in an approximate semi-circle in a direction away from side surfaces 88 that are opposite side surfaces 86 that face each other of protruding sections 80 of the pair of holders 72 and 74. That is, first bottom surface 82 is formed on the side surface 86 side of protruding section 80, and second bottom surface 84 is formed on the side surface 88 side of protruding section 80. Second bottom surface 84 protrudes lower than first bottom surface 82, but is positioned above the lower end of protruding section 80.

Further, connecting section 76 is connected to the pair of holders 72 and 74 on opposite side surfaces to the side surfaces of the pair of holders 72 and 74 that face each other. The width dimension of connecting section 76 is approximately the same as the outer diameter of main body section 78 of holders 72 and 74, and the outer wall surface of connecting section 76 and the outer peripheral surface of main body section 78 are smoothly continuous. Note that, the outer diameter of main body section 78 of holders 72 and 74 is approximately the same as the width dimension of flange section 34 of internal block 12, as described above. Also, the length dimension of connecting section 76 is designed such that the length dimension of holding member 20 matches the length dimension of flange section 34 of internal block 12. Thus, the width and length dimensions of holding member 20 are approximately the same as the width and length dimensions of flange section 34 of internal block 12.

Further, bottom surface 90 of connecting section 76 is flush with first bottom surface 82 of main body section 78 of holders 72 and 74, and bottom surface 90 of connecting section 76 and first bottom surface 82 of main body section 78 are smooth flat surfaces. Connecting section 76 is formed with through-hole 96 extending vertically between the pair of holders 72 and 74, and through-hole 96 opens to the upper surface of connecting section 76 at the upper end and opens to the lower surface of connecting section 76 at the lower end.

As shown in FIG. 3, holding member 20 with such a construction is combined with internal block 12. More specifically, protruding sections 80 of the pair of holders 72 and 74 of holding member 20 are inserted into a pair of cylindrical recesses 36 and 38 of internal block 12. As a result, the lower end of protruding sections 80 faces stepped surfaces 46 and 48 of cylindrical recesses 36 and 38. However, the depth dimension of cylindrical recesses 36 and 38 is greater than the protrusion amount of protruding section 80 from second bottom surface 84. Therefore, second bottom surface 84 of holding member 20 contacts the top surface of internal block 12, and the lower end of protruding section 80 and stepped surfaces 46 and 48 of cylindrical recesses 36 and 38 face each other with a clearance. In this manner, when holding member 20 is combined with internal block 12, connecting recess 40 of internal block 12 is covered by holding member 20 such that reaction chamber 100 is partitioned by connecting recess 40 and holding member 20.

Further, as described above, the width dimension and the length dimension of holding member 20 are approximately the same as the width dimension and the length dimension of flange section 34 of internal block 12. Therefore, the lower end of holding member 20 combined with internal block 12 is accommodated in second accommodation section 64 of lower block 14 together with flange section 34 of internal block 12.

Each of the pair of electrodes 24 and 26 is generally cylindrical and the outer diameter of electrodes 24 and 26 is smaller than the inner diameter of holders 72 and 74 of holding member 20. Further, electrodes 24 and 26 are held inside holders 72 and 74 by sockets 102 in a vertically extending attitude. The lower ends of electrodes 24 and 26 project from the lower end of holder 72, that is, the lower end of protruding section 80, and are inserted into reaction chamber 100.

Also, the lower ends of electrodes 24 and 26 inserted into reaction chamber 100 are wedge-shaped with their end faces facing each other. In detail, the lower ends of the pair of electrodes 24 and 26 slope downwardly from side surfaces 106 of the pair of electrodes 24 and 26 that face each other toward side surfaces 108 that are opposite to side surfaces 106. That is, lower end surfaces 110 of the pair of electrodes 24 and 26 slope towards each other. In other words, the angle formed by side surface 106 and lower end surface 110 is an obtuse angle, and the angle formed by side surface 108 and lower end surface 110 is an acute angle. To put it another way, lower end surface 110 of electrodes 24 and 26 is a tapered surface that goes down from side surface 106 to side surface 108.

Further, connecting member 28 is plate shaped, and insertion hole 120 extending vertically is formed in connecting member 28. Insertion hole 120 opens to the upper surface of connecting member 28 at the upper end and opens to the lower surface of connecting member 28 at the lower end. The inner dimension of insertion hole 120 is slightly larger than the widthwise and lengthwise dimensions of holding member 20. Also, connecting member 28 is fixed to the upper surface of lower block 14 in a state with holding member 20 inserted through insertion hole 120. Note that, the upper surface of connecting member 28 and the upper surface of connecting section 76 of holding member 20 are approximately the same height, and the upper ends of holders 72 and 74 of holding member 20, that is, main body section 78, extend upward from the upper surface of connecting member 28.

Upper block 30 has a generally cuboid shape, and formed therein are pair of recesses 126 that open to the lower surface of upper block 30. The inner dimension of recesses 126 is slightly larger than the outer dimension of main body section 78 of holders 72 and 74. Further, lower surface of upper block 30 is fixed to the upper surface of connecting member 28 in a state with main body section 78 of holders 72 and 74 fitted into recesses 126. The depth dimension of recesses 126 is larger than the extension amount of main body section 78 from the upper surface of connecting member 28. Thus, there is clearance between the bottom surface of recess 126 and main body section 78. Annular elastic body 128 is inserted into the clearance in a compressed state. As a result, holding member 20 is biased downward by the elastic force of elastic member 128, and internal block 12 and holding member 20 are in close contact with each other in accommodation section 60 of lower block 14.

Pair of first connecting passages 130 connected to pair of recesses 126 are formed in upper block 30. First connecting passage 130 is connected to a supply device (not shown) for supplying a processing gas composed only of an inert gas such as nitrogen. Further, second connecting passage 132 connected to through-hole 96 of holding member 20 is formed in upper block 30. Second connecting passage 132 is connected to a supply device (not shown) for supplying processing gas in which an active gas such as oxygen in the air and an inert gas such as nitrogen are mixed at a given ratio.

(B) Generation of Plasma by Atmospheric Pressure Plasma-Generating Device

With atmospheric pressure plasma-generating device 10, processing gas is converted into plasma in reaction chamber 100 by the above-described configuration, and plasma is emitted from third flow path 70 of emitting nozzle 18. Plasma generation by atmospheric pressure plasma generator 10 is described below in detail.

In atmospheric pressure plasma-generating device 10, processing gas composed only of an inert gas is supplied from first connecting passage 130 to reaction chamber 100 through the inside of holders 72 and 74 of holding member 20. Processing gas composed of inert gas and active gas is supplied from the second connecting passage 132 to reaction chamber 100 via through-hole 96 of holding member 20. When this occurs, in reaction chamber 100, pair of electrodes 24 and 26 is energized, and current flows between the pair of electrodes 24 and 26. Thus, an electrical discharge occurs between the pair of electrodes 24 and 26, and the processing gas is plasmarized by the electrical discharge. Further, in reaction chamber 100, since electrodes 24 and 26 are arranged at positions close to the wall surface of connecting recess 40 of internal block 12, a current flows along the wall surface of connecting recess 40 by the application of current to electrodes 24 and 26. As a result, electrical discharge occurs not only between the pair of electrodes 24 and 26, but also along the wall surface of connecting recess 40, and the processing gas is converted into plasma by that discharge. Then, the plasma generated in reaction chamber 100 flows through first flow path 50 of internal block 12 to second flow path 66 of lower block 14. Further, the plasma flows into third flow path 70 of emitting nozzle 18, and the plasma is applied to the target object from the lower end of third flow path 70.

(C) Enhancement of Durability of Atmospheric Pressure Plasma-Generating Device

In this manner, with atmospheric pressure plasma-generating device 10, processing gas is converted into plasma by the electrical discharge inside reaction chamber 100, and plasma is emitted from third flow path 70 of emitting nozzle 18. Note that, plasma refers to a state in which molecules constituting a gas are ionized and separated into positive ions and electrons, and corresponds to an ionized gas. Such plasma is generated in reaction chamber 100 and is ejected from reaction chamber 100 into first flow path 50.

However, the gas ionized inside reaction chamber 100 is sequentially ejected from reaction chamber 100 to first flow path 50, and when the gas enters a very narrow region, the ionized gas may stay in the narrow region. For example, with the contact surfaces of the members demarcating reaction chamber 100, since the surfaces are in contact with each other, it is considered that there is no gap. However, when considering the size of the molecules that constitute a gas, ionized gas enters between adjacent members even if the surfaces of the members contact each other. When the ionized gas enters between contact surfaces forming such a very narrow region, the ionized gas stays inside the contact surfaces, and the discharge concentrates on the ionized gas, which may cause charring of the contact surfaces. In particular, with reaction chamber 100, since discharge is generated between pair of electrodes 24 and 26, if a contact surface exists between the pair of electrodes 24 and 26, the contact surface is likely to be charred, and members demarcating reaction chamber 100, that is, internal block 12, holding member 20, and the like, are likely to deteriorate. In addition, there is a fear that the discharge will not be stable due to the concentration of discharge on the contact surface.

Figure 8:
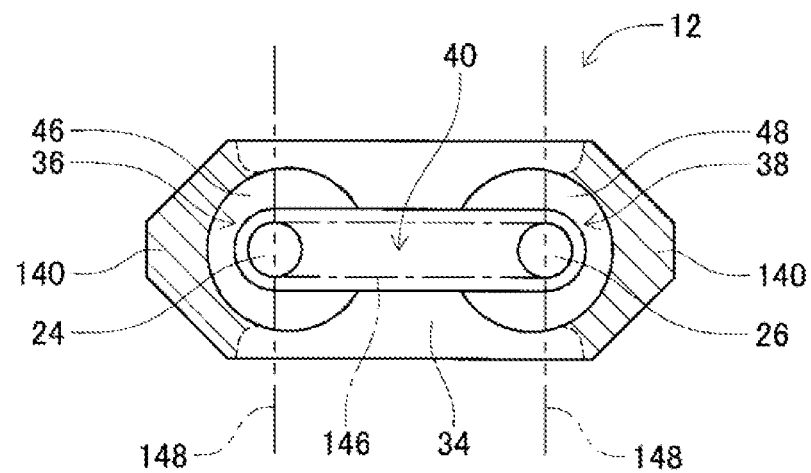
FIG. 8 is a plan view of the internal block.

In view of this, atmospheric pressure plasma-generating device 10 is configured such that in reaction chamber 100, there is only a contact surface on the side opposite to pair of electrodes 24 and 26. More specifically, as described above, reaction chamber 100 is demarcated by holding member 20 and internal block 12, and protruding sections 80 of pair of holders 72 and 74 of holding member 20 are inserted into pair of cylindrical recesses 36 and 38 of internal block 12. As a result, the lower end of protruding sections 80 faces stepped surfaces 46 and 48 of cylindrical recesses 36 and 38. However, the depth dimension of cylindrical recesses 36 and 38 is greater than the protrusion amount of protruding section 80 from second bottom surface 84. Therefore, second bottom surface 84 of holding member 20 contacts the top surface of internal block 12, and the lower end of protruding section 80 and stepped surfaces 46 and 48 of cylindrical recesses 36 and 38 face each other with a clearance. That is, only second bottom surface 84 of holding member 20 contacts internal block 12. To put it another way, as shown in FIG. 8, on the upper surface of flange section 34 of internal block 12, only a portion (oblique lines in the drawing) corresponding to the shape of second bottom surface 84 of holding member 20 becomes contact surface 140 to holding member 20.

This contact surface 140 is located on the opposite side to the position between pair of electrodes 24 and 26 inserted into connecting recess 40 of internal block 12. That is, with atmospheric pressure plasma-generating device 10, in reaction chamber 100, the contact surface between internal block 12 and holding member 20, that is, second bottom surface 84 and contact surface 140, is provided only on the side opposite to the position between pair of electrodes 24 and 26.

Note that, the space between pair of electrodes 24 and 26 is a width corresponding to the diameters of electrodes 24 and 26, and does not only represent a region connecting pair of electrodes 24 and 26, but also represents a region between two straight lines that are perpendicular to a straight line connecting pair of electrodes 24 and 26 and that pass through pair of electrodes 24 and 26. Specifically, the region connecting pair of electrodes 24 and 26 with a width corresponding to the diameters of electrodes 24 and 26 is an area surrounded by single-dash broken line 146 in FIG. 8. On the other hand, two straight lines passing through pair of electrodes 24 and 26 and perpendicular to the straight line connecting pair of electrode 24 and 26 are the two-dash broken lines 148 in FIG. 8. Thus, between pair of electrodes 24 and 26 means between the two two-dash broken lines 148. That is, with atmospheric pressure plasma-generating device 10, in reaction chamber 100, the contact surface between internal block 12 and holding member 20 exists only on the side opposite to the space between the pair of two-dash broken lines 148.

Figure 9:
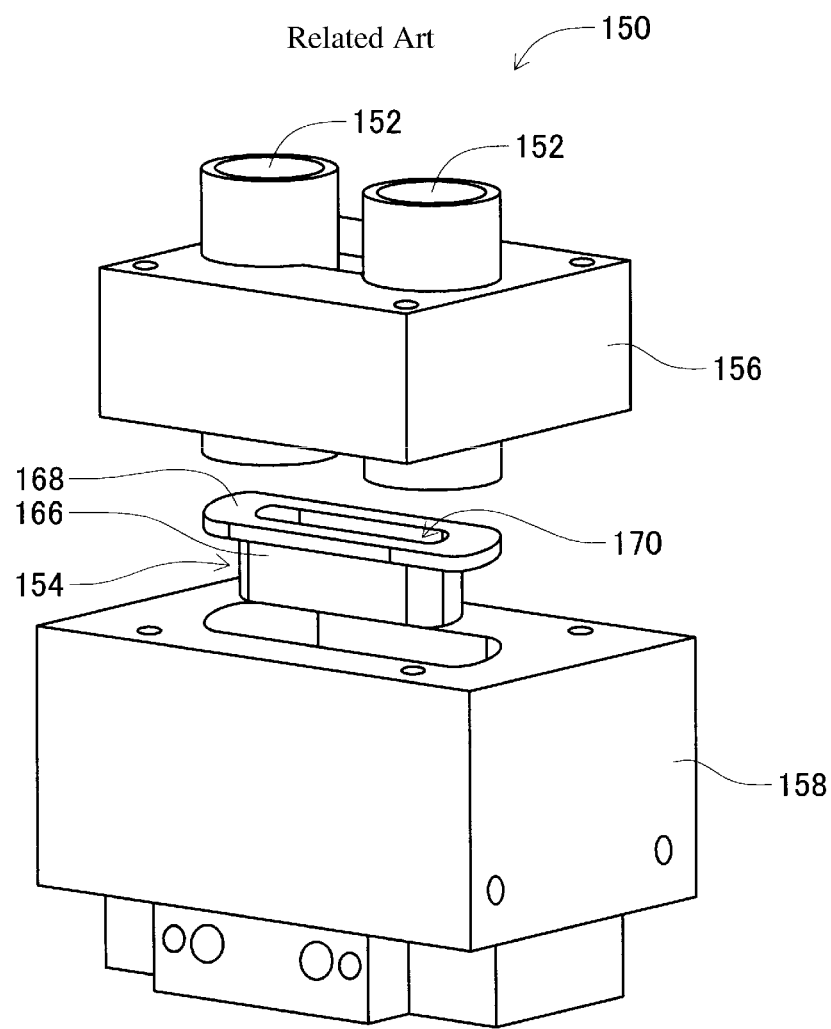
FIG. 9 is an exploded view showing a conventional atmospheric pressure plasma-generating device.

On the other hand, as shown in FIG. 9, conventional atmospheric pressure plasma-generating device 150 includes pair of holders 152, internal block 154, connecting member 156, lower block 158, an emitting nozzle (not shown), and an upper block (not shown). Here, with atmospheric pressure plasma-generating device 150, the inner portion of internal block 154 functions as a reaction chamber by assembling the lower surfaces of pair of holders 152 to the upper surface of internal block 154. Therefore, only holders 152 and internal block 154 will be described.

The pair of holders 152 have a cylindrical shape, and a lower end surface of the cylindrical shape is a flat surface. Further, internal block 154 includes generally cuboid main body section 166 and flange section 168 formed at the upper end of main body section 166. Recess 170 is formed on internal block 154 and recess 170 opens to the upper surface of flange section 168 and into the interior of main body section 166. Except for recess 170, the upper surface of flange section 168 is flat, and flange section 168 has a width dimension substantially the same as the diameter of holders 152. Further, holders 152 and internal block 154 are combined such that the lower surface of holders 152 contacts the upper surface of internal block 154, that is, the upper surface of flange section 168. As a result, recess 170 of internal block 154 is demarcated by holders 152 as a reaction chamber. Further, by pair of electrodes 176 and 178 (refer to FIG. 10) being inserted into pair of holders 152, the lower ends of the pair of electrodes 176 and 178 enter inside recess 170.

Figure 10:
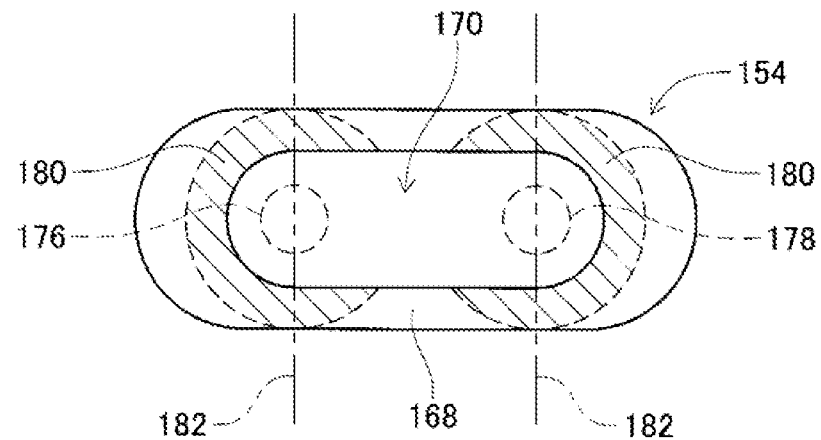
FIG. 10 is a plan view showing an internal block of a conventional atmospheric pressure plasma-generating device.

As described above, with atmospheric pressure plasma-generating device 150, holders 152 and internal block 154 are combined so that the lower end surfaces of flat holders 152 contact the upper end surface of flat internal block 154. Due to this, as shown in FIG. 10, a portion of the upper surface of internal block 154 corresponding to the shape of the lower end surface of holders 152 (oblique lines in the drawing) becomes contact surface 180 at which contact to holders 152 occurs. Contact surface 180 extends between pair of electrodes 176 and 178. That is, contact surface 180 extends into the region between two straight lines 182 that pass through pair of electrodes 176 and 178 and perpendicular to the straight line connecting the pair of electrodes 176 and 178.

In this manner, when the contact surface between holders 152 and internal blocks 154 demarcating the reaction chamber exists between the pair of electrodes 176 and 178, gas ionized by the electrical discharge generated between electrodes 176 and 178 easily enters contact surface 180. In particular, when discharge occurs along the wall surface demarcating the reaction chamber, ionized gas easily enters contact surface 180. When ionized gas enters contact surface 180 and remains, the discharge concentrates on contact surface 180. This causes contact surface 180 to be charred and deteriorate. In this manner, with conventional atmospheric pressure plasma-generating device 150, holders 152 and internal block 154 that demarcate the reaction chamber are liable to deteriorate and are not durable. In order to improve the durability, it is conceivable to use a material having high heat resistance as the material of holders 152 or the like, but the costs are high.

On the other hand, with atmospheric pressure plasma-generating device 10, as shown in FIG. 8, in reaction chamber 100, contact surface 140 between internal block 12 and holding member 20 exists only on side opposite to the position between the pair of electrodes 24 and 26. That is, contact surface 140 between internal block 12 and holding member 20 does not exist between the pair of electrodes 24 and 26. Therefore, even if discharge occurs between pair of electrodes 24 and 26, ionized gas does not easily penetrate into contact surface 140 between internal block 12 and holding member 20. In addition, even if discharge occurs from pair of electrodes 24 and 26 along the walls that demarcate reaction chamber 100, penetration to contact surface 140 does not occur easily. As a result, deterioration of contact surface 140 between internal block 12 and holding member 20 due to charring can be prevented, and durability of internal block 12 and holding member 20 is improved. In this manner, with atmospheric pressure plasma-generating device 10, by devising the shape of internal block 12 and the like without changing the materials of internal block 12 and the like, the high costs due to material change are prevented, and the durability of internal block 12 and the like is improved. Further, by suppressing the concentration of discharge on the contact surface, stable discharge is ensured.

Also, as shown in FIG. 3, protruding section 80 that protrudes down from second bottom surface 84 is formed between second bottom surface 84 of holding member 20 and electrodes 24 and 26, and stepped surfaces 46 and 48 that are recessed downward are formed between contact surface 140 of internal block 12 and electrodes 24 and 26. In addition, protruding section 80 and stepped surfaces 46 and 48 face each other with a clearance. By this configuration, the contact surface between internal block 12 and holding member 20 is positioned above the lower ends of electrodes 24 and 26. Also, protruding section 80 extends to cover the contact surface between internal block 12 and holding member 20. As a result, gas ionized by the electrical discharge between electrodes 24 and 26 is less likely to penetrate the contact surface between internal block 12 and holding member 20, thus further improving the durability of internal block 12 and the like.

Note that, holding member 20 is supported by the upper surface of internal block 12 only at second bottom surface 84 of pair of holders 72 and 74. That is, holders 72 and 74 are supported by the upper surface of internal block 12 only at one of the ends of the bottom surface of the approximate cylindrical holders, meaning that the stability is low. Thus, pair of holders 72 and 74 are connected by connecting section 76 to ensure the stability of holding member 20.

(D) Stable Generation of Plasma by Electrode Discharge

With atmospheric pressure plasma-generating device 10, as described above, discharge occurs between electrodes 24 and 26 to generate plasma. Therefore, with atmospheric pressure plasma-generating device 10, the lower ends of electrodes 24 and 26 are wedge-shaped in order to achieve stable discharge between the electrodes.

More specifically, in a conventional atmospheric pressure plasma-generating device, electrodes have a cylindrical shape, and the angle formed by the side surface of the electrode and the lower end surface of the electrode is a right angle. That is, at the lower ends of a pair of electrodes, the corners at which the sides and the lower end meet at 90 degrees face each other, and the lower end surfaces face directly downward and do not face each other at all. Discharge occurs between the lower ends of the pair of electrodes by supplying electric power to the pair of electrodes. Here, since the lower end surfaces of the pair of electrodes are not facing each other at all, discharge does not occur easily between the lower end surface one of the pair of electrodes and the lower end surface of the other electrode, and it is considered that discharge is generated between the 90-degree corner portion of one of the pair of electrodes and the 90-degree corner portion of the other electrode.

Such concentrated discharge at the corners of the electrodes can cause slight disturbances in the power supplied to the electrodes. More specifically, when a current is stably supplied to the electrode, the current changes periodically. On the other hand, in a conventional atmospheric pressure plasma-generating device, the amplitude may decrease in several cycles out of several hundred to several thousand cycles. In such a case, the discharge may stop for a moment, which is undesirable.

In view of this, with atmospheric pressure plasma-generating device 10, the lower ends of electrodes 24 and 26 are wedge-shaped, and lower end surfaces 110 of pair of electrodes 24 and 26 face each other. That is, at the lower ends of pair of electrodes 24 and 26, the corner portions where side surface 106 and lower end surface 110 form an obtuse angle face each other, and lower end surfaces 110 also face each other. It is considered that discharge occurs between the corner with the obtuse angle of one of the pair of electrodes 24 and 26 and the corner with the obtuse angle of the other electrode, and that discharge occurs between the lower end surface 110 of one of the pair of electrodes 24 and 26 and the lower end surface 110 of the other of the electrodes by electric power being supplied to the pair of electrodes 24 and 26. In this case, electric power is stably supplied to the electrode as compared with the case where electric discharges are concentrated between the 90-degree corner portion of one of the pair of electrodes and the 90-degree corner portion of the other electrodes. That is, the amplitude does not decrease even for several cycles out of several hundred to several thousand cycles. As a result, discharge occurs stably between the electrodes, and stable generation of plasma can be ensured.

Note that, in an embodiment above, atmospheric pressure plasma generation device 10 is an example of a plasma generation device. Internal block 12 is an example of a casing. Electrodes 24 and 26 are examples of an electrode. Upper block 30 is an example of a block. Connecting recess 40 is an example of a first recess. Stepped surfaces 46 and 48 are examples of a stepped surface. Holders 72 and 74 are examples of a holder. Connecting section 76 is an example of a connecting section. Protruding section 80 is an example of a protruding section. Recess 126 is an example of a second recess. Elastic body 128 is an example of an elastic body.

Figure 11:
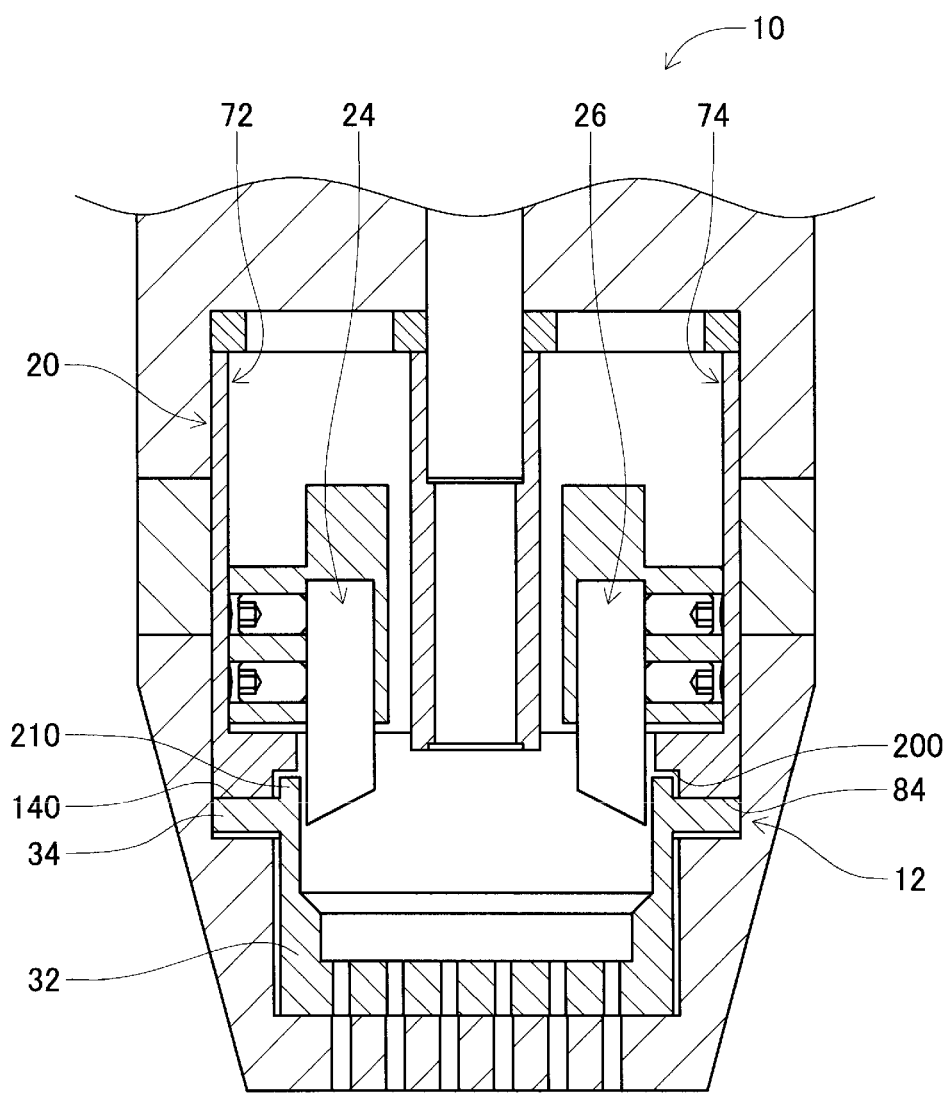
FIG. 11 is a cross section showing an atmospheric pressure plasma-generating device of an alternative embodiment.

Further, the present disclosure is not limited to the above example embodiments, and various changed or improved methods of embodiment are possible based on the knowledge of someone skilled in the art. Specifically, for example, in an embodiment above, as shown in FIG. 3, protruding section 80 protruding down from second bottom surface 84 is formed on the bottom surface of holders 72 and 74, and stepped surfaces 46 and 48 recessed downward from contact surface 140 are formed on the top surface of lower block 14. Second bottom surface 84 and contact surface 140 are in contact with each other, and protruding section 80 and stepped surfaces 46 and 48 are facing each other with a clearance. On the other hand, as shown in FIG. 11, stepped surface 200 recessed upward from second bottom surface 84 may be formed on bottom surface of holders 72 and 74, and protruding section 210 protruding upward from contact surface 140 may be formed on the top surface of lower block 14. Further, second bottom surface 84 and contact surface 140 may be in contact with each other, and stepped surface 200 and protruding section 210 may face each other with a clearance.

Further, in an embodiment above, the present disclosure is applied to atmospheric pressure plasma-generating device 10, but the present disclosure may be applied to a plasma-generating device in which plasma is generated under reduced pressure.

Also, in an embodiment above, as shown in FIG. 8, the space between pair of electrodes 24 and 26 is defined as a space between two straight lines (two-dash broken lines 148) passing through the pair of electrodes 24 and 26 and perpendicular to the straight line connecting the pair of electrodes 24 and 26, but the space is not limited thereto and may be defined in various manners. For example, the space between pair of electrodes 24 and 26 may be defined as the space between two straight lines passing through side surfaces 106 of the discharging sides of the pair of electrodes 24 and 26 and perpendicular to the straight line connecting the pair of electrodes 24 and 26.

In addition, dry air may be used as the processing gas in an embodiment above.

REFERENCE SIGNS LIST

10: atmospheric pressure plasma generation device (plasma generation device);

12: internal block (casing);
24: electrode;
26: electrode;
30: upper block (block);
40: connecting recess (first recess);
46: stepped surface;
48: stepped surface;
72: holder;
74: holder;
76: connecting section;
80: protruding section;
126: recess (second recess);
128: elastic body

The invention claimed is:

1. A plasma-generating device comprising:
   a pair of electrodes;
   a pair of holders each including a lower end and configured to hold the pair of electrodes, ends of the electrodes projecting from the lower end of the pair of holders; and
   a casing including a top surface and a contact position, the casing configured to combine with the pair of holders, the casing including a pair of stepped surfaces recessed from a top surface of the casing, wherein
   the contact position of the casing and the lower end of the pair of holders is outward of the pair of stepped surfaces at an opposite side of the pair of electrodes relative to a side of the pair electrodes between the ends of the pair of electrodes.

2. A plasma-generating device according to claim 1, wherein
   the pair of holders includes a protruding section formed between the electrodes and the contact position where the pair of holders and the casing contact each other and configured to protrude towards the casing.

3. A plasma-generating device according to claim 2, wherein
   the pair of stepped surfaces are formed between the electrodes and the contact position and are configured to face the protruding section with a clearance gap between the stepped surfaces and the protruding section.

4. A plasma-generating device according to claim 1, wherein
   the pair of holders are connected by a connecting section.

5. A plasma-generating device comprising:
   a pair of electrodes;
   a pair of holders each including a lower end and configured to hold the pair of electrodes, ends of the pair electrodes projecting from the lower end of the pair of holders; and
   a casing including a contact position and a top surface in which is formed a pair of stepped surfaces and a first recess arranged between the pair of stepped surfaces, the casing configured to combine with the pair of holders in a state with the ends of the pair of electrodes are inserted into the first recess, wherein
   the contact position of the casing and the lower end of the pair of holders is outward of the pair of stepped surfaces at an opposite side of the pair of electrodes relative to a side of the pair electrodes between the ends of the pair of electrodes.

6. A plasma-generating device comprising:
   a pair of electrodes;
   a pair of holders configured to hold the pair of electrodes, first ends of the pair electrodes projecting from a lower end of the pair of holders;
   a block in which is formed a recess into which second ends of the pair of electrodes are inserted, the second ends opposite to the first ends of the pair of electrodes;
   an elastic body between the recess and the second ends of the pair of electrodes; and
   a casing configured to combine with the pair of holders, wherein
   the combined casing and the pair of holders contact each other only at an opposite side to a side between the first ends of the pair of electrodes that project from the pair of holders.

* * * * *